(12) United States Patent
Nakaya

(10) Patent No.: US 8,640,071 B2
(45) Date of Patent: Jan. 28, 2014

(54) CIRCUIT DESIGN SYSTEM AND CIRCUIT DESIGN METHOD

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 181 days.

(21) Appl. No.: 12/995,598

(22) PCT Filed: May 15, 2009

(86) PCT No.: PCT/JP2009/002141
§ 371 (c)(1),
(2), (4) Date: Dec. 1, 2010

(87) PCT Pub. No.: WO2009/147789
PCT Pub. Date: Dec. 10, 2009

(65) Prior Publication Data
US 2011/0078645 A1    Mar. 31, 2011

(30) Foreign Application Priority Data
Jun. 6, 2008   (JP) ................... 2008-149704

(51) Int. Cl.
*G06F 17/50*    (2006.01)

(52) U.S. Cl.
USPC ........... 716/116; 716/104; 716/117; 716/121; 716/126; 716/128; 716/132; 716/135

(58) Field of Classification Search
USPC ......... 716/104, 116–117, 121, 126, 128, 132, 716/135
See application file for complete search history.

(56) References Cited

U.S. PATENT DOCUMENTS

| 5,128,871 | A | * | 7/1992 | Schmitz ........................ 716/102 |
| 5,436,576 | A | * | 7/1995 | Hibdon et al. .................. 326/47 |
| 5,457,409 | A | * | 10/1995 | Agrawal et al. ................ 326/39 |
| 5,469,003 | A | * | 11/1995 | Kean .............................. 326/39 |
| 5,477,475 | A | * | 12/1995 | Sample et al. ................ 716/104 |
| 5,537,341 | A | * | 7/1996 | Rose et al. .................... 716/104 |
| 5,789,939 | A | * | 8/1998 | Agrawal et al. ................ 326/41 |
| 5,831,448 | A | * | 11/1998 | Kean .............................. 326/41 |
| 6,301,696 | B1 | * | 10/2001 | Lien et al. ..................... 716/116 |

(Continued)

FOREIGN PATENT DOCUMENTS

| JP | 2000124317 A | 4/2000 |
| JP | 2006172219 A | 6/2006 |

OTHER PUBLICATIONS

International Search Report for PCT/JP2009/002141 mailed Jun. 30, 2009.

*Primary Examiner* — Stacy Whitmore

(57) ABSTRACT

A circuit design system 10 includes storage means 11 to store structure description information 11a of a reconfigurable circuit including an array of cells 1 including a plurality of switches 2, and application circuit netlist information 11b used to specify an application, circuit generation unit 12a to generate structure description information 11a based on the structure description information 11a and the application circuit netlist information 11b stored in the storage means 11, and circuit evaluation unit 12b to evaluate the structure description information 11a generated by the circuit generation unit 12a, wherein the circuit generation unit 12a generates the structure description information 11a by deleting at least one of the switches 2 from the structure description information 11a based on an evaluation result obtained by the circuit evaluation unit 12b.

17 Claims, 13 Drawing Sheets

(56) References Cited

U.S. PATENT DOCUMENTS

| | | | |
|---|---|---|---|
| 6,526,563 B1 * | 2/2003 | Baxter | 716/103 |
| 6,738,961 B2 * | 5/2004 | Snider | 716/128 |
| 7,124,392 B2 * | 10/2006 | Sharma | 716/116 |
| 7,342,414 B2 * | 3/2008 | DeHon et al. | 326/41 |
| 7,614,029 B2 * | 11/2009 | Manohar | 716/138 |
| 7,797,665 B1 * | 9/2010 | Xu et al. | 716/128 |
| 2003/0163796 A1 * | 8/2003 | Snider | 716/12 |
| 2005/0257186 A1 * | 11/2005 | Zilbershlag | 716/18 |
| 2008/0168407 A1 * | 7/2008 | Manohar | 716/3 |
| 2009/0009215 A1 * | 1/2009 | Matsumoto et al. | 326/41 |
| 2011/0089972 A1 * | 4/2011 | Pani et al. | 326/41 |

* cited by examiner

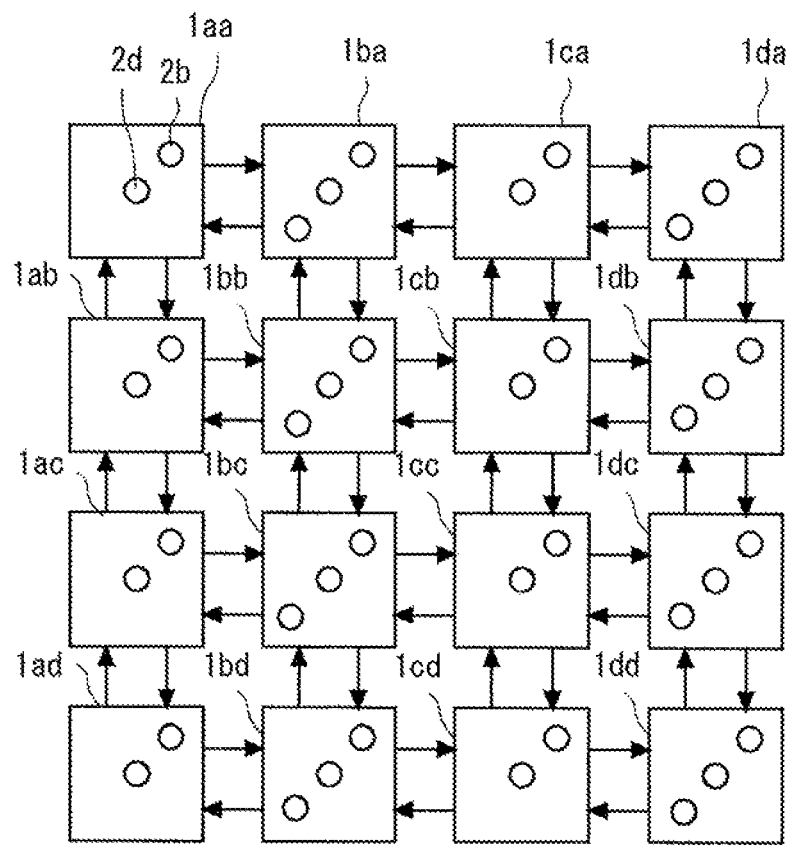

CIRCUIT DESIGN SYSTEM AND CIRCUIT DESIGN METHOD

This application is the National Phase of PCT/JP2009/002141, filed May 15, 2009, which is based upon and claims the benefit of priority from Japanese patent application No. 2008-149704, filed on Jun. 6, 2008, the disclosure of which is incorporated herein in its entirety by reference.

TECHNICAL FIELD

The present invention relates a circuit design system and a circuit design method, in particular a circuit design system and a circuit design method to generate structure description information based on structure description information of a reconfigurable circuit including an array of cells including a plurality of switches and application circuit netlist information.

BACKGROUND ART

In recent years, reconfigurable circuits (programmable logic circuits) such as field-programmable gate arrays (FPGAs) and programmable logic devices (PLDs) have such a high degree of flexibility that they can achieve extremely various circuits, and therefore they have been widely used in the fields of digital circuit devices and the likes. However, there is a problem in such reconfigurable circuits that since they use a huge amount of switches to achieve the high degree of flexibility, the circuit size becomes larger and the costs increase.

To solve this problem, it is conceivable to apply an application-specific reconfigurable circuit of which the application area (applications) is limited so that it has minimum flexibility sufficient to cover that particular application area. Although this application-specific reconfigurable circuit has limited flexibility in comparison to the general-purpose circuits, it has an advantage that the circuit size can be significantly reduced.

Meanwhile, information processing systems in which, in order to specify a circuit to be formed in a programmable logic circuit, a designated circuit is formed in the programmable logic circuit by using circuit information designated by an application program have been known (for example, see Patent literature 1).

CITATION LIST

Patent Literature

Japanese Unexamined Patent Application Publication No. 2000-124317

SUMMARY OF INVENTION

Technical Problem

In the above-described related information processing system, it is possible to form a reconfigurable circuit specified to certain application circuits, i.e., reconfigurable circuit specified to a certain application area. However, in this information processing system, for example, a high level architecture description that describes the configuration of a reconfigurable circuit by specifying simple parameters is used in order to make the description easier and make adjustments to the configuration according to the application easier. Therefore, the above-described configuration adjustments become somewhat rough, thus raising a possibility that the effect of reducing the circuit size could be lowered.

The present invention has been made to solve the problem like this, and a main object thereof is to provide a circuit design system and a circuit design method capable of effectively reducing the circuit size.

Solution to Problem

To achieve the above-described object, an aspect of the present invention is a circuit design system including: storage means to store structure description information of a reconfigurable circuit including an array of cells including a plurality of switches, and application circuit information used to specify an application; circuit generation means to generate structure description information based on the structure description information and the application circuit information stored in the storage means; and circuit evaluation means to evaluate the structure description information generated by the circuit generation means, wherein the circuit generation means generates the structure description information by deleting at least one of the switches from the structure description information based on an evaluation result obtained by the circuit evaluation means.

Another aspect of the present invention to achieve the above-described object is a circuit design method including: a storage step of storing structure description information of a reconfigurable circuit including an array of cells including a plurality of switches, and application circuit information used to specify an application; a circuit generation step of generating structure description information based on the structure description information and the application circuit information stored in the storage step; and a circuit evaluation step of evaluating the structure description information generated by the circuit generation step, wherein in the circuit generation step, the structure description information is generated by deleting at least one of the switches from the structure description information based on an evaluation result obtained in the circuit evaluation step. Further, another aspect of the present invention to achieve the above-described object is a storage medium storing a program that causes a computer to execute: a process of generating structure description information based on structure description information of a reconfigurable circuit including an array of cells including a plurality of switches, and application circuit information used to specify an application; a process of evaluating the generated structure description information; and a process of generating the structure description information by deleting at least one of the switches from the structure description information based on the evaluation result.

Advantageous Effects of Invention

In accordance with the present invention, the circuit size can be effectively reduced.

BRIEF DESCRIPTION OF DRAWINGS

FIG. 10C shows an example of a cell array in which switches are deleted from each cell located on odd-numbered columns among a cell array of a minimum uniform reconfiguration circuit in a nonuniform manner:

FIG. 12A shows an example of a reconfigurable circuit before performing a switch delete process;

FIG. 12B is a schematic diagram showing an example of a minimum uniform reconfiguration circuit formed by performing a uniform switch deletion on a reconfigurable circuit;

FIG. 12C shows an example of a minimum nonuniform configuration circuit formed by performing a row-nonuniform switch deletion on a reconfigurable circuit;

FIG. 12D shows an example of a minimum nonuniform configuration circuit formed by performing a column-nonuniform switch deletion on a reconfigurable circuit;

FIG. 12E shows a configuration example in which a nonuniform switch deletion is performed on a minimum uniform configuration circuit, and an example of a nonuniform switch deletion in the form of a checker pattern.

DESCRIPTION OF EMBODIMENTS

Best modes for carrying out the present invention are explained by using exemplary embodiments with reference to the attached drawings.

[First Exemplary Embodiment]

Figure 1:
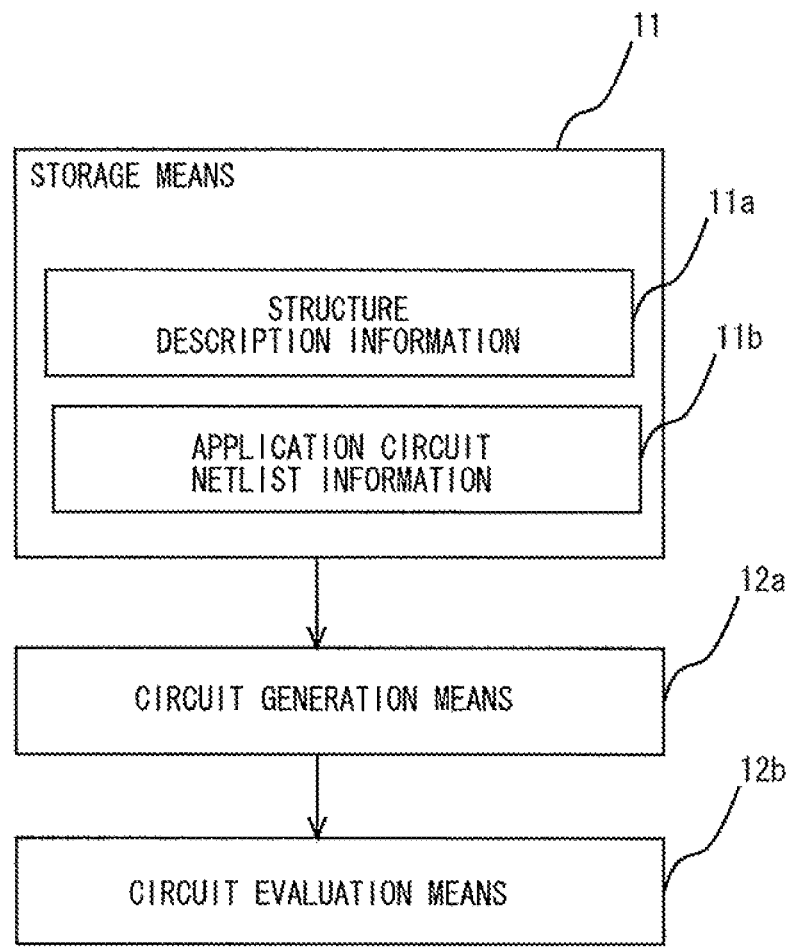
FIG. 1 is a block diagram showing functions of a circuit design system in accordance with a first exemplary embodiment of the present invention.

FIG. 1 is a block diagram showing functions of a circuit design system in accordance with a first exemplary embodiment of the present invention. A circuit design system 10 in accordance with the first exemplary embodiment includes storage means 11 to store structure description information 11a of a reconfigurable circuit and application circuit netlist information 11b, circuit generation means 12a to generate structure description information based on the structure description information 11a and the application circuit netlist information 11b, and circuit evaluation means 12b to evaluate the generated structure description information 11a.

The above-described structure description information 11a is composed of an array of cells including a plurality of switches, and the application circuit netlist information 11b specifies an application of the reconfigurable circuit. The circuit generation means 12a generates structure description information by deleting at least one switch from the structure description information 11a base on an evaluation result obtained by the circuit evaluation means 12b. In this way, the circuit size can be effectively reduced.

Figure 2:
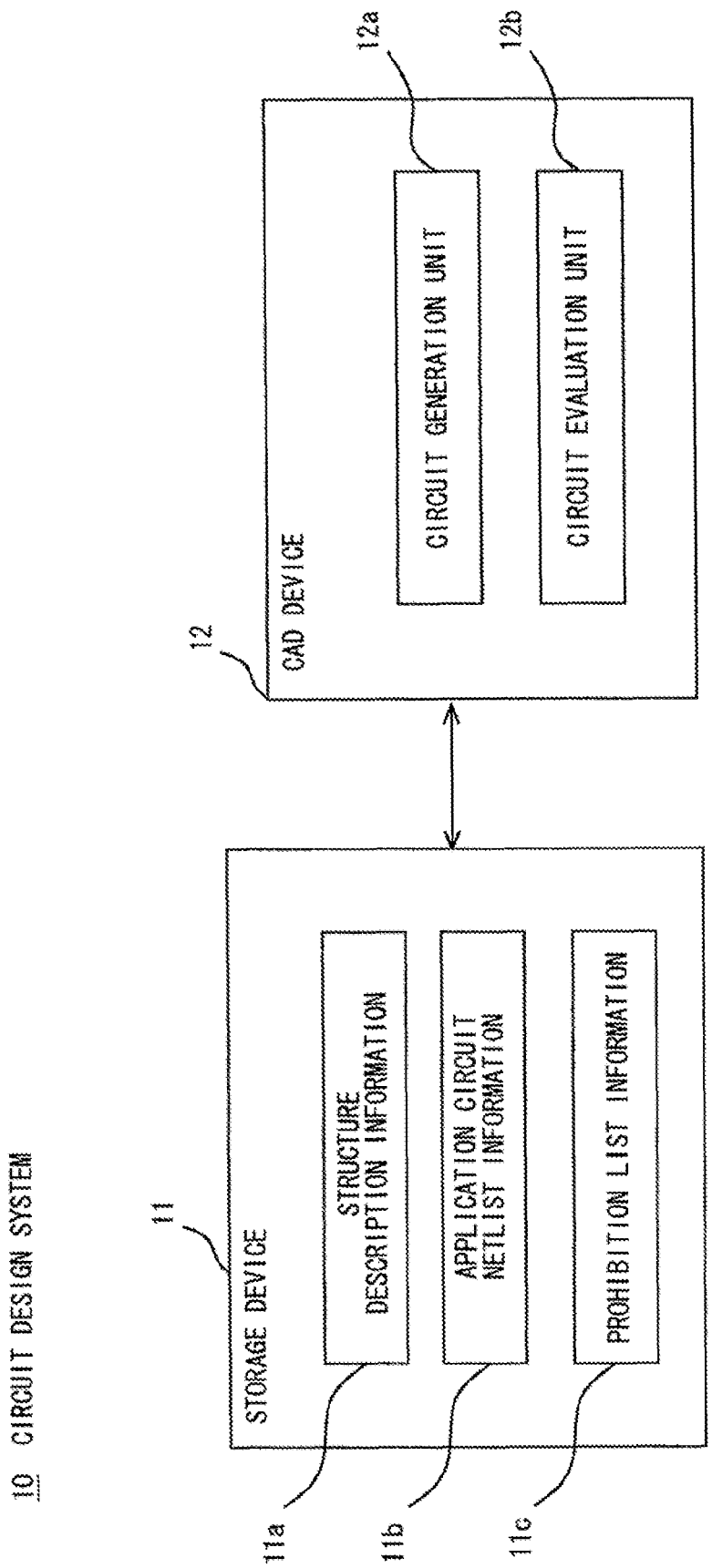
FIG. 2 is a block diagram showing an example of a system configuration of a circuit design system in accordance with a first exemplary embodiment of the present invention.

FIG. 2 is a block diagram showing an example of a system configuration of the circuit design system 10 in accordance with the first exemplary embodiment of the present invention. The circuit design system 10 in accordance with the first exemplary embodiment includes a storage device 11 and a CAD device 12.

The storage device 11 stores structure description information 11a of a reconfigurable circuit composed of an array of cells 1 (cell array) including a plurality of switches (hereinafter referred to as "structure description information), and application circuit netlist information 11b.

The structure description information (architecture description information) 11a is mother architecture description information (initial structure description information) in which a very wide variety of application circuits can be mapped. This initial structure description information expresses a reconfigurable circuit having a number of routing resources such as lines and switches by detailed structure descriptions such as a routing resource graph specifying individual switches and lines (hereinafter, simply referred to as "structure description"). Note that since the only requirement for the structure description of the initial configuration is to store it in the storage device 11 at the start, the burden on the operator caused for the structure description is not very large in comparison to the conventional technique.

Further, the application circuit netlist information 11b is netlist information used to specify an application circuit to be mapped on the reconfigurable circuit (programmable logic circuit).

The storage device 11 stores one or more than one structure description information pieces 11a and one or more than one application circuit netlist information pieces 11b. Further, as for the storage device 11, a magnetic disc device or an optical disc device, for example, may be used.

The CAD (Computer Aided Design) device 12 includes a circuit generation unit 12a that generates structure description information 11a and a circuit evaluation unit 12b that evaluates the generated structure description information 11a.

The circuit generation unit 12a generates structure description information 11a based on the structure description information 11a and the application circuit netlist information 11b stored in the storage device 11. Further, the circuit generation unit 12a maps application circuit netlist information 11b, for example, on a placement-and-routing tool into which structure description information 11a was taken, and carries out placement and routing.

The circuit evaluation unit 12b evaluates the structure description information 11a generated by the circuit generation unit 12a. For example, the circuit evaluation unit 12b evaluates at least one of success/failure of the placement and routing obtained when the application circuit netlist information 11b is mapped on the structure description information 11a, routing property (degree of easiness or difficulty of routing), maximum circuit delay (or critical path delay), power consumption, the number of switches, and circuit size.

More specifically, the circuit evaluation unit 12b evaluates whether the placement and routing is possible or not when the application circuit netlist information 11b is mapped on the structure description information 11a. Then, when the placement and routing is possible, the circuit evaluation unit 12b evaluates the maximum circuit delay and/or the power consumption of the circuit expressed by the structure description information 11a by comparing them with their respective pass thresholds. Further, when it is possible to perform the placement and routing at the time when the application circuit netlist information 11b was mapped on the structure description information 11a, the circuit evaluation unit 12b evaluates the number of switches and/or the circuit size of the structure description information 11a by comparing them with their respective pass thresholds. Furthermore, when it is possible to perform the placement and routing at the time when the application circuit netlist information 11b was mapped on the structure description information 11a, the circuit evaluation unit 12b evaluates a combination of the above-described properties (e.g., a value of circuit size×circuit delay) by comparing it with a pass threshold.

Note that the evaluation method implemented by the circuit evaluation unit 12b is not limited to the above-described example, and may be arbitrarily determined by the user. Further, the circuit generation unit 12a generates structure description information 11a by deleting at least one switch from the structure description information 11a based on an evaluation result obtained by the circuit evaluation unit 12b.

Further, the CAD device 12 includes a CPU (Central Processing Unit) that performs control processing, arithmetic processing, and the like as the main hardware component, and also includes a ROM (Read Only Memory) that stores a control program, an arithmetic program, and the like to be executed by the CPU and a RAM (Random Access Memory) that temporarily stores processing data. Further, the circuit generation unit 12a and the circuit evaluation unit 12b are implemented by, for example, a program(s) that is stored in the above-described ROM and executed by the CPU. In this case, the computer program can be provided by recoding it in a recording medium, or can be provided by transmitting it through a communication medium such as the Internet or the like. Examples of the storage medium include a flexible disc, a hard disc, a magnetic disc, a magneto-optic disc, a CD-ROM, a DVD, a ROM cartridge, a RAM memory cartridge with battery backup, a flash memory cartridge, and a nonvolatile RAM cartridge. Further, examples of the communication medium include a wired communication medium such as a telephone line, and a wireless communication medium such as a microwave line.

Figure 3:
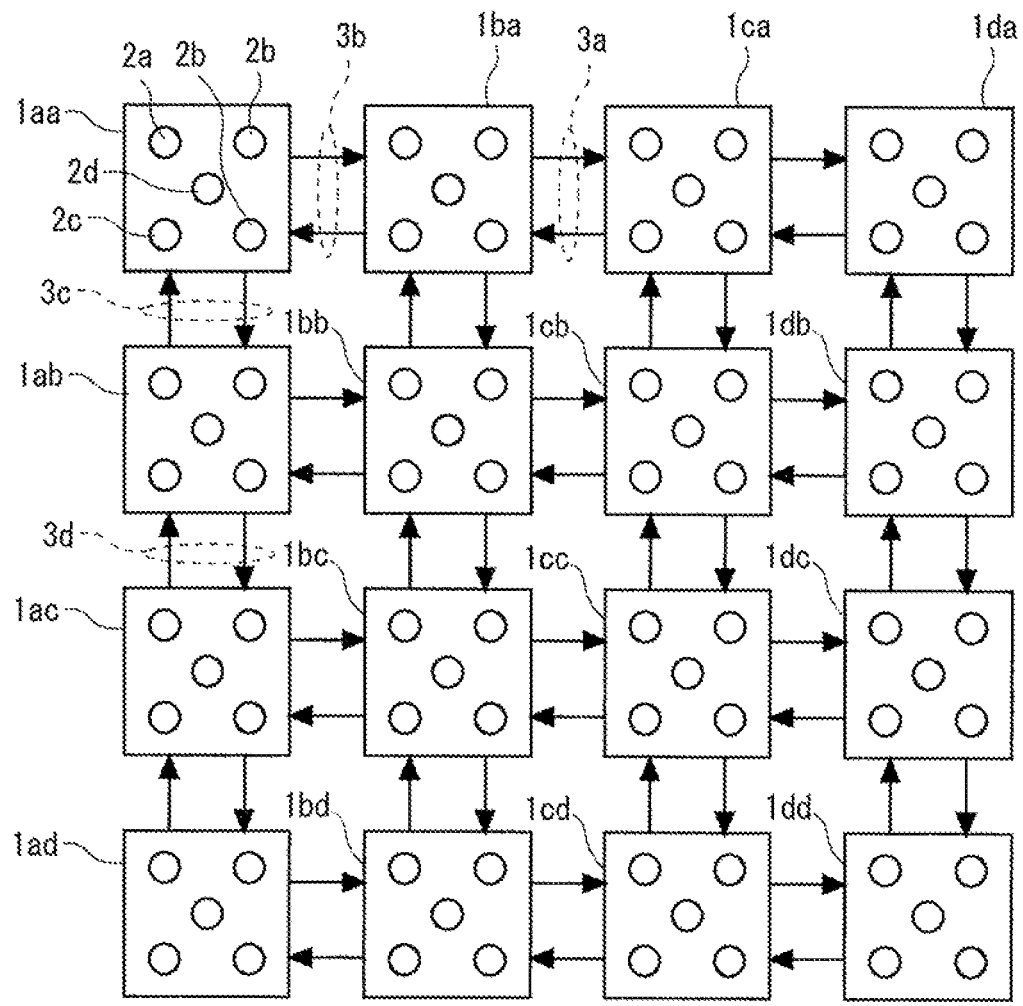
FIG. 3 is a block diagram showing an example of a reconfigurable circuit expressed by structure description information in which cells are arranged in a two-dimensional array.

FIG. 3 is a block diagram showing an example of a reconfigurable circuit expressed by structure description information 11a in which cells 1 are arranged in a two-dimensional array. In FIG. 3, each cell 1xy (x is one of "a" to "d", and y is one of "a" to "d") includes five switches 2a, 2b, 2c, 2d and 2e and has the same configuration. Further, "x" and "y" indicate the position of each cell 1. Note that although an example where each of "x" and "y" is one of "a", "b", "c" and "d" and thus the cell array is composed of four rows and four columns is shown in FIG. 3, the size of the cell array can be arbitrarily determined.

Further, neighboring cells 1xy are connected to each other through lines 3a and 3b that transmit a signal in the horizontal direction and lines 3c and 3d that transmit a signal in the vertical direction. Furthermore, although five switches 2a, 2b, 2c, 2d and 2e are provided in each cell 1xy, the number of provided switches can be arbitrarily determined.

Figure 4:
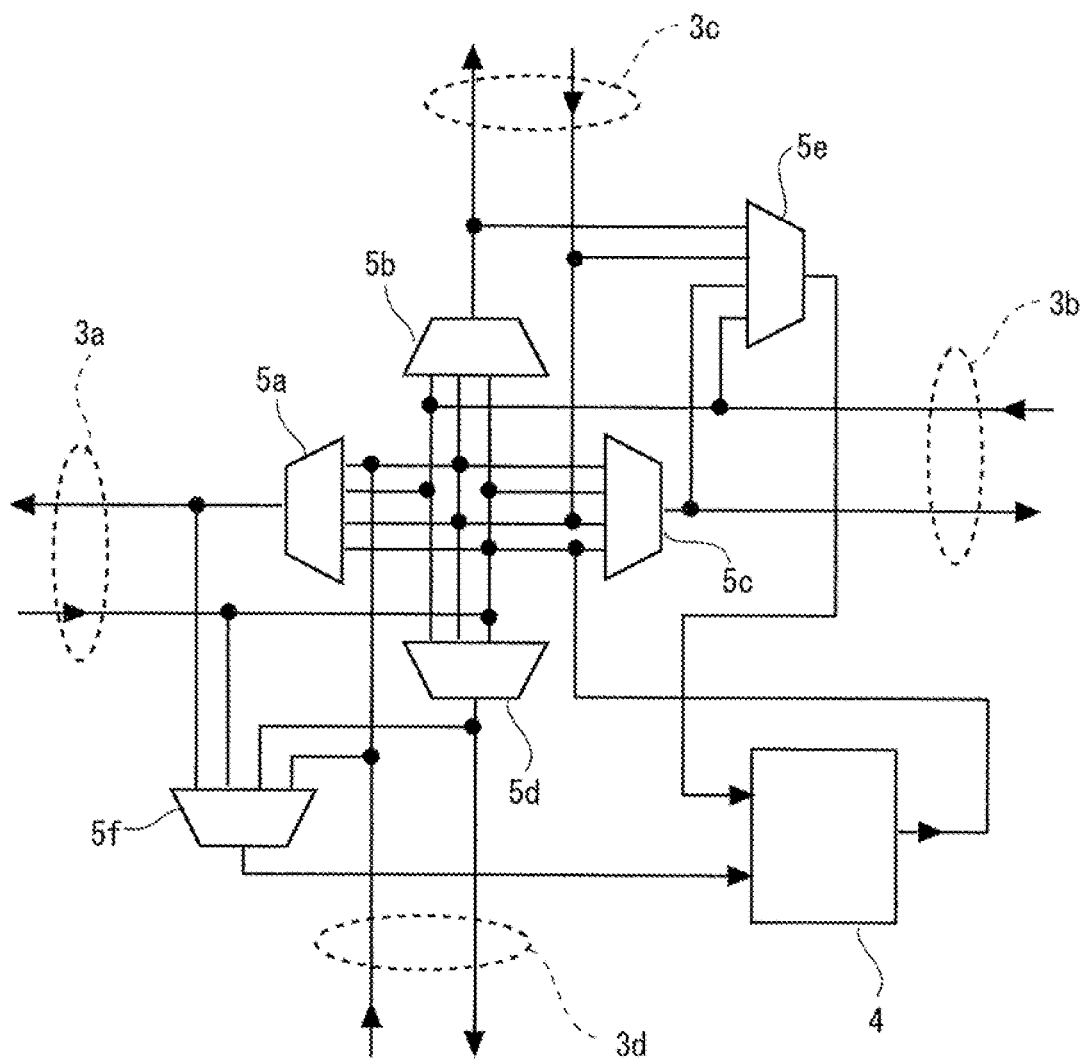
FIG. 4 is a block diagram showing a configuration example of one of cells constituting a reconfigurable circuit expressed by structure description information.

FIG. 4 is a block diagram showing a configuration example of one of cells 1xy constituting a reconfigurable circuit expressed by the above-described structure description information 11a. Each cell 1xy includes one functional block 4 and six multiplexers 5a, 5b, 5c, 5d, 5e and 5f. Various functions can be configured in the functional block 4 according to configuration data.

Each of the multiplexers 5e and 5f selects an input signal to be input to the functional block 4 from a group of lines 3a, 3b, 3c and 3d according to the configuration data. Meanwhile, each of the multiplexers 5a, 5b, 5c and 5d forms a connection between two of the lines 3a, 3b, 3c and 3d, or between the output of the functional block 4 and one of the lines 3a, 3b, 3c and 3d according to the configuration data. Note that the number of the multiplexers 5a to 5f and the functional block 4, the number of the input lines, the number of the routing lines, and the length of the routing lines are not limited to those of the example shown in FIG. 4.

Figure 5:
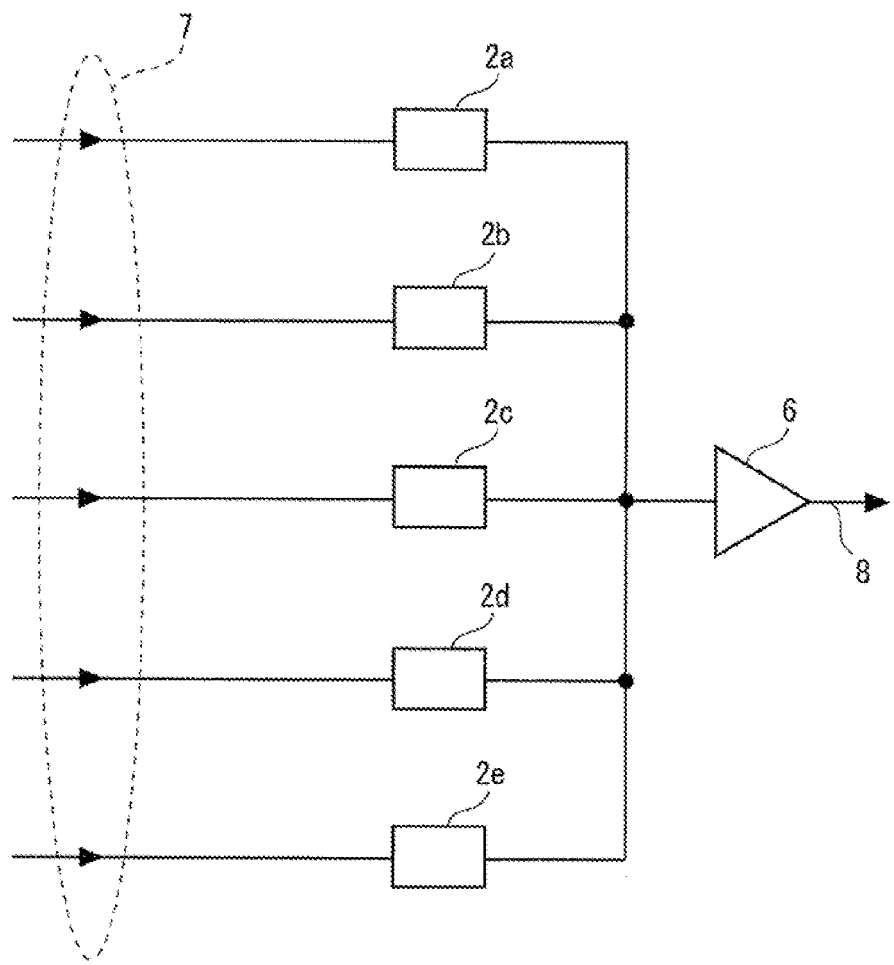
FIG. 5 is a block diagram showing an example of a configuration of a multiplexer of a reconfigurable circuit expressed by structure description information.

FIG. 5 is a block diagram showing an example of a configuration of a multiplexer 5 of a reconfigurable circuit expressed by structure description information 11a. The multiplexer 5 includes, for example, five switches 2a to 2e and one buffer 6. Each of input lines 7 is connected to one end of one of the switches 2a to 2e, and the other ends of the switches 2a to 2e are connected to the input of the buffer 6. Further, the output 8 of the buffer 6 serves as the output of the multiplexers 5a to 5f.

Note that although the multiplexer 5 includes five input lines 7 and five switches 2a to 2e, the number of the provided input lines 7 and switches 2 can be arbitrarily determined. Further, it is also possible to employ such a configuration that multiplexers 5 including different numbers of input lines 7 and switches 2 are mixed. Further, the multiplexer 5 is not limited to the above-described example, and various known configurations other than the above example shown in FIG. 5 may be also employed.

Figure 6:
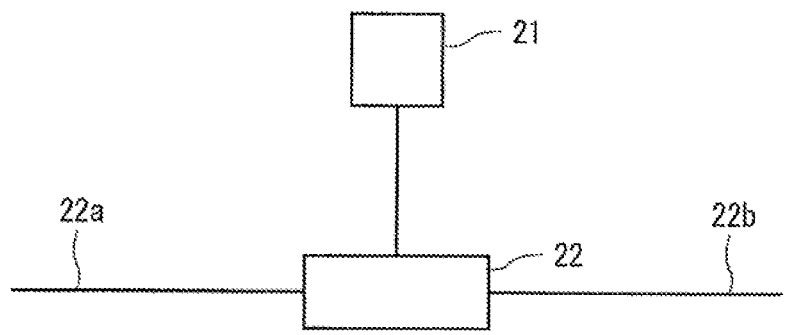
FIG. 6 is a block diagram showing a configuration example of a switch of a multiplexer.

FIG. 6 is a block diagram showing a configuration example of a switch 2 of the multiplexer 5. The switch 2 includes a configuration memory 21 and a transmission gate 22. Whether the connection between both ends of the transmission gate 22 is in a connected state or in a cut-off state is determined based on configuration data stored in the configuration memory 21. Further, the configuration memory 21 is constructed from, for example, a rewritable memory element such as an EEPROM and an SRAM.

Figure 7:
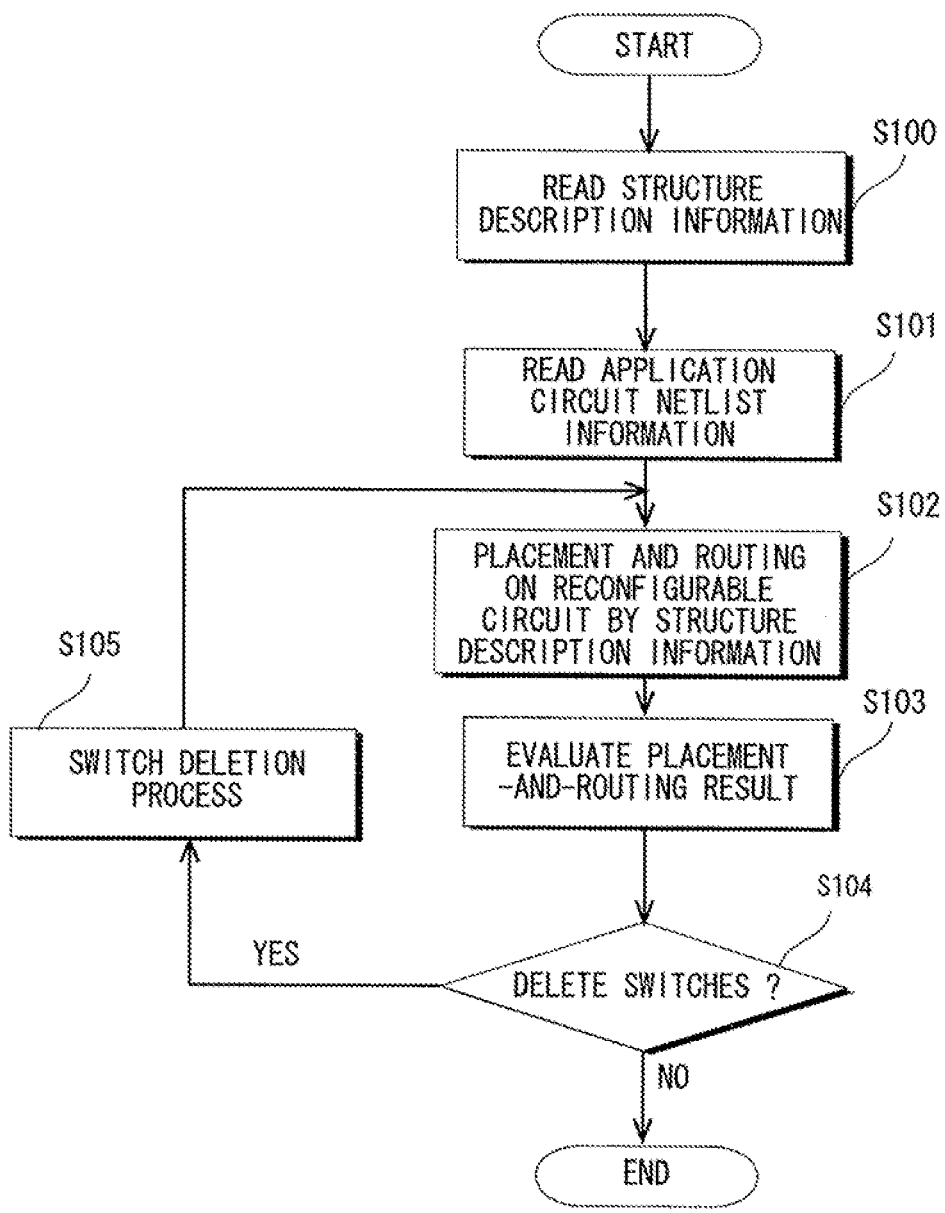
FIG. 7 is a flowchart showing an example of a flow of a circuit design method of a circuit design system in accordance with a first exemplary embodiment of the present invention.

Next, a circuit design method of a circuit design system 10 in accordance with the first exemplary embodiment of the present invention is explained. FIG. 7 is a flowchart showing an example of a flow of a circuit design method of a circuit design system 10 in accordance with the first exemplary embodiment.

The circuit generation unit 12a of the CAD device 12 reads structure description information 11a stored in the storage device 11 (step S100). Further, the circuit generation unit 12a also reads application circuit netlist information 11b stored in the storage device 11 (step S101).

Next, the circuit generation unit 12a places and routes an application circuit expressed by the application circuit netlist information 11b on a reconfigurable circuit expressed by the structure description information 11a, for example, by a placement-and-routing tool into which the structure description information 11a was taken (step S102).

After that, the circuit evaluation unit 12b evaluates a result of the above-described placement and routing (step S103). Note that if there are two or more structure description information pieces 11a, the circuit evaluation unit 12b makes an evaluation for each of the structure description information pieces 11a.

Further, the circuit generation unit 12a also determines whether or not switches 2 should be further deleted from the structure description information 11a base on the evaluation result of the circuit evaluation unit 12b (step S104). For example, if the circuit evaluation unit 12b makes an evaluation that it is impossible to perform the placement and routing when the application circuit netlist information 11b is mapped, or that the maximum circuit delay and/or the power consumption are not improved, the circuit generation unit 12a determines that switches 2 should not be further deleted from the structure description information 11a (No at step S104).

On the other hand, if the circuit evaluation unit 12b makes an evaluation that it is possible to perform the placement and routing, or that the maximum circuit delay and/or the power consumption are improved, the circuit generation unit 12a determines that switches 2 should be deleted from the structure description information 11a (Yes at step S104). Note that the setting of the above-described evaluation method can be arbitrarily changed by the user.

When the circuit generation unit 12a determines that switches 2 should be further deleted from the structure description information 11a (Yes at step S104), the circuit generation unit 12a first generates new structure description information 11a by deleting at least one switch 2 from the structure description information 11a (step S105) and then the process returns to the above-described step S102.

At this point, for example, assuming that one switch 2 is to be deleted from each cell 1xy including n switches 2, n types of new structure description information pieces 11a are generated. Note that the details of the switch delete process are described later. In the following explanation, structure description information 11a obtained by deleting switches 2 in the switch delete process is referred to as "switch-deleted structure description information 11a".

On the other hand, if the circuit generation unit 12a determines that no switch should be further deleted from the structure description information 11a (No at step S104), this process is finished. As a result, switch-deleted structure description information 11a having the best evaluation result among the above-described switch-deleted structure description information pieces 11a is adopted as the final design circuit information.

Note that when the circuit evaluation unit 12b makes an evaluation that it is possible to perform the placement and routing when the application circuit netlist information 11b is mapped and that no switch should be further deleted by the circuit generation unit 12a (No at step S104), structure description information 11a having the best evaluation result given by the circuit evaluation unit 12b, among the switch-deleted structure description information pieces 11a which have been generated until that point and for which it is determined that it is possible to perform the placement and routing, is adopted as the final structure description information 11a. Further, examples of the structure description information 11a having the best evaluation result include a circuit of which the maximum circuit delay, the power consumption, the number of switches 2, and/or the circuit size are smallest.

Figure 8:
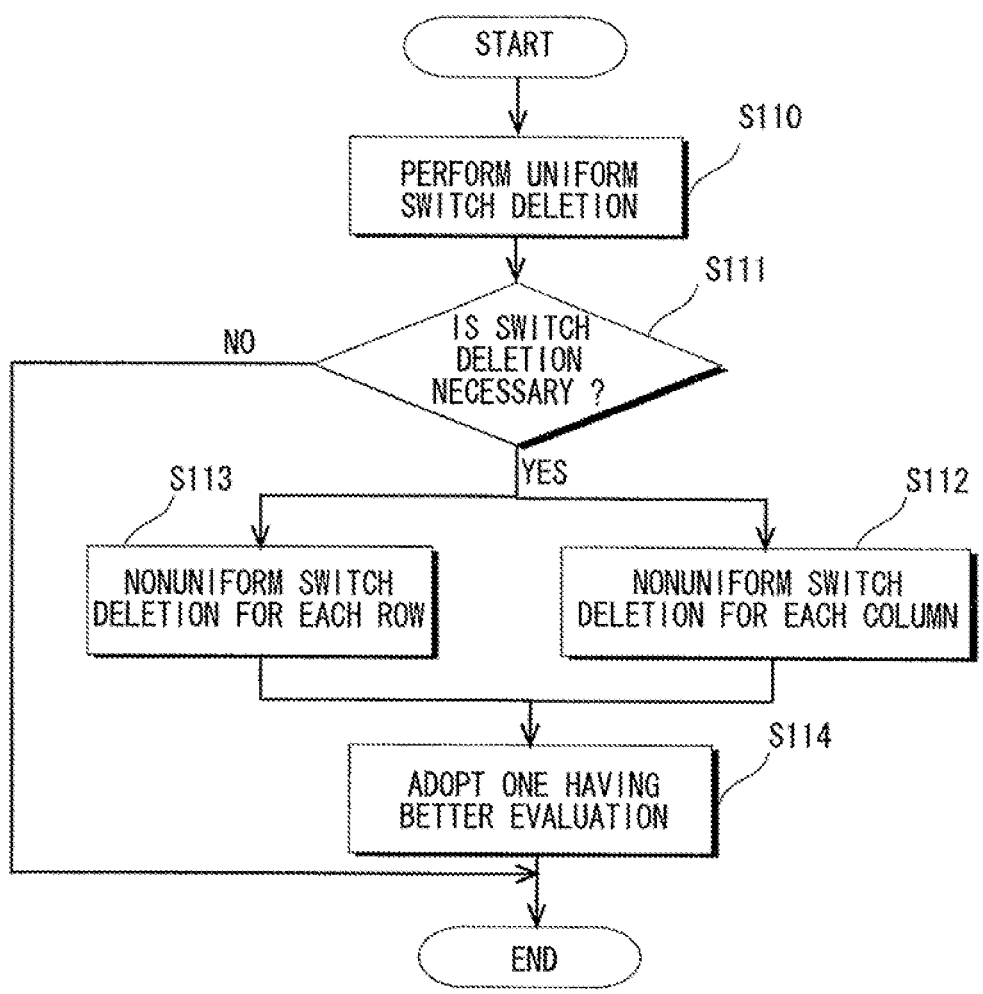
FIG. 8 is a flowchart showing an example of a process flow in a switch delete process.

Next, the above-described switch delete process for deleting switches 2 from the structure description information 11a (step S105) is explained in detail. FIG. 8 is a flowchart showing an example of a process flow in a switch delete process.

As shown in FIG. 8, in the switch delete process (step S105), firstly, a uniform switch deletion in which a switch 2 is uniformly deleted from each cell 1xy is performed (step S110). Further, when a further switch deletion is necessary (Yes at step S111), a nonuniform switch deletion in which a switch 2 is non-uniformly deleted from each cell 1xy is performed after the uniform switch deletion (steps S112 and S113).

In this nonuniform switch deletion, the circuit generation unit 12a deletes a switch 2 from each cell 1xy on a column-by-column basis in the cell array expressed by the switch-deleted structure description information 11a (step S112). At the same time, the circuit generation unit 12a deletes a switch 2 from each cell 1xy on a row-by-row basis in the cell array (step S113). Then, the circuit generation unit 12a adopts switch-deleted structure description information 11a having a better evaluation between these switch-deleted structure description information pieces 11a in which switches 2 are deleted on the column-by-column basis and on the row-by-row basis (step S114).

Figure 9A:
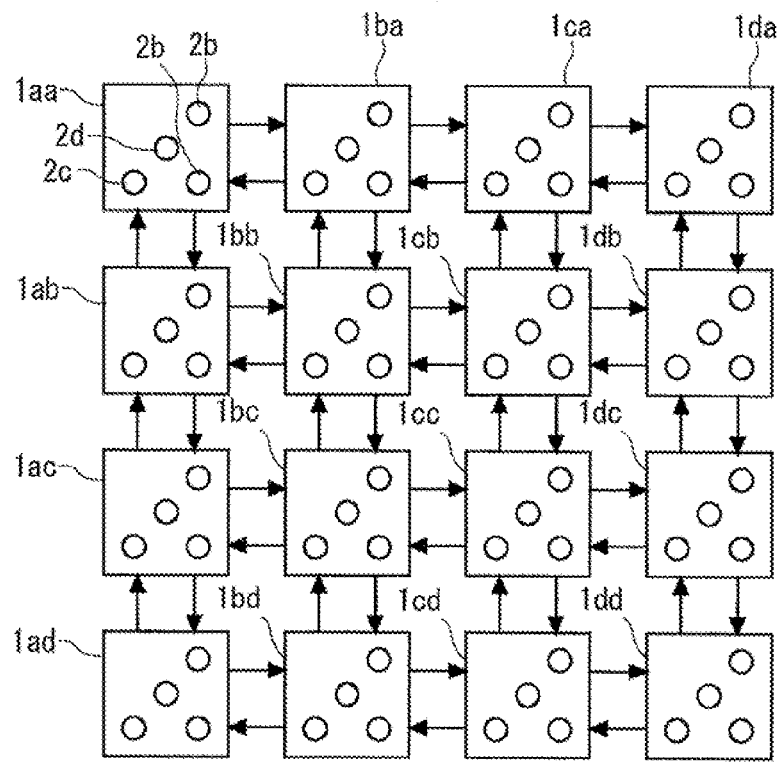
FIG. 9A shows an example of a uniform switch deletion in which the same switches are deleted from all the cells.
Figure 9B:
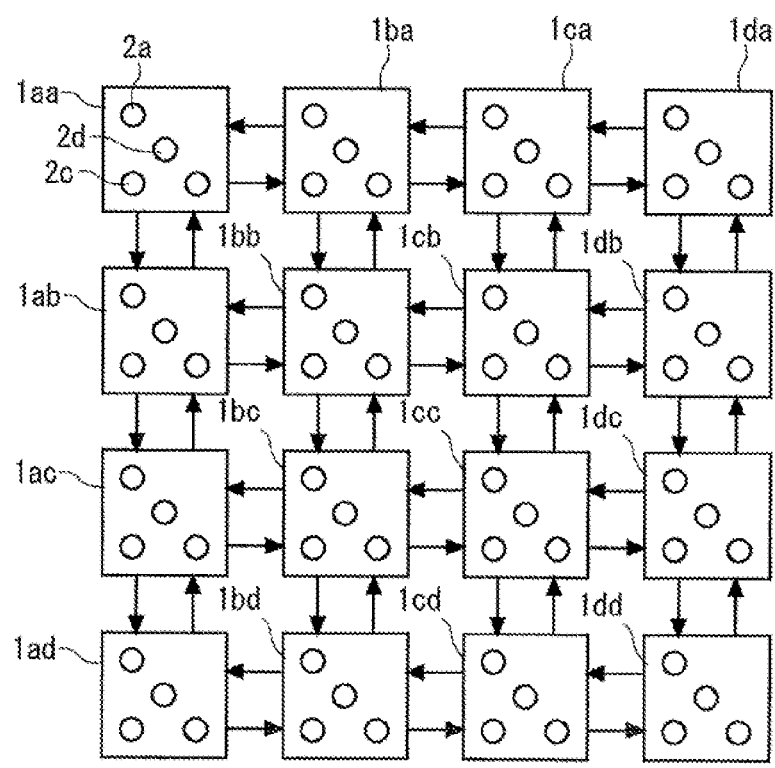
FIG. 9B shows an example of a uniform switch deletion in which the same switches are deleted from all the cells.

Next, the above-described uniform switch deletion is explained in detail. In the uniform switch deletion, as shown in FIG. 9A, for example, the same switch 2a is deleted from each of all the cells 1xy shown in FIG. 3. Further, in the uniform switch deletion, as shown in FIG. 9B, for example, the same switch 2b is deleted from each of all the cells 1xy shown in FIG. 3. In this way, in the uniform switch deletion, the same switch 2 is deleted from each of all the cells 1xy in the cell array.

Note that only two ways of deleting the switch 2a or 2b from each of all the cells 1xy are shown in FIGS. 9A and 9B. However, in general, when each cell 1xy includes n switches 2, there are n types of ways of deleting one switch 2 from each cell 1xy. Therefore, when one switch 2 is to be deleted from each cell 1xy, n types of switch-deleted structure description information pieces 11a are generated.

Further, as described above, the circuit generation unit 12a places and routes an application circuit expressed by the application circuit netlist information 11b on the reconfigurable circuit expressed by the switch-deleted structure description information 11a by a placement-and-routing tool into which the switch-deleted structure description information 11a was taken (step S102).

Further, the circuit evaluation unit 12b evaluates the result of the above-described placement and routing (step S103). Note that the circuit evaluation unit 12b makes an evaluation for each of the n types of switch-deleted structure description information pieces 11a, and the circuit generation unit 12a determines whether or not switches should be further deleted from the switch-deleted structure description information 11a based on the evaluation result (step S104). In this manner, the deletion process in which one switch 2 is deleted from each cell 1xy of the switch-deleted structure description information 11a is repeated.

Note that the circuit evaluation unit 12b preferably evaluates a routing property (degree of easiness or difficulty of routing) when the application circuit netlist information 11b is mapped. Further, the circuit generation unit 12a performs the routing process in such a manner that various ways of routing are tried. Note that the upper-limit number T of the routing trials in this routing process is determined in advance. Then, if the routing is not completed before or when the number of routing trials reaches the upper-limit number T, the circuit evaluation unit 12b determines that it is impossible to perform the placement and routing when the application circuit netlist information 11b is mapped.

In this process, the number r1 of the remaining lines that were not be able to be routed, or the number r2 of the remaining conflicts (the number of places where two or more lines require the use of the same routing resource) can be used as an evaluation value for the degree of easiness or difficulty of routing. On the other hand, if all the routings have been completed without causing any conflict by t times of routing trials (t<T), for example, before the circuit generation unit 12a performs T times of routing trials, this number t of wring trials can be used as an evaluation value for the degree of easiness or difficulty of routing.

For example, when the routing has not been completed after the circuit generation unit 12a performed T times of routing trials, it can be still safely said that the smaller the above-described number r1 of remaining lines and the number r2 of remaining conflicts are, the easier the routing is and the better the routing property is. Similarly, when the routing has been completed before or when the circuit generation unit 12a performs T times of routing trials, it can be still safely said that the smaller the above-described number t of trials is, the easier the routing is and the better the routing property is.

Then, the circuit generation unit 12a performs a switch delete process based on the evaluation result obtained by the circuit evaluation unit 12b that the evaluation value such as the above-described number r1 of remaining lines, the number r2 of remaining conflicts, and the number t of trials is smaller than its pass threshold and hence the routing property is excellent. In this way, the number of the switch-deleted structure description information pieces 11a on which a switch delete process is to be performed can be effectively narrowed down, thus significantly reducing the processing time. Note that even if there are a number of switch-deleted structure description information pieces 11a on which a switch delete process is to be performed, it is still possible to sufficiently reduce the number of switches, while also reducing the processing time, by setting the pass threshold at a suitable value by using the above-described evaluation value.

Further, it is preferable to use prohibition list information 11c in order to effectively narrow down the number of switch-deleted structure description information pieces 11a. The prohibition list information 11c is a list in which switch deletion patterns of which the evaluation value is worse than a certain threshold (hereinafter called "prohibition threshold") are recorded.

It is presumed that a switch deletion pattern contained in the prohibition list information 11c, in other words, switch-deleted structure description information 11a obtained by further deleting switches from a switch deletion pattern contained in the prohibition list information 11c and the like must have a poor routing property without so much as performing placement and routing as well as evaluation.

Note that the above-described evaluation values for the degree of easiness of routing can be compared with one another only when they are compared between switch-deleted structure description information pieces 11a having the same number of switches. Therefore, in order to apply this processing method, it is necessary that the same number of switches are deleted from each cell 1xy in the switch delete process. As a most preferable example, a uniform switch deletion in which one switch 2 is deleted from each of switch-deleted structure description information pieces 11a on which a switch delete process is to be performed (i.e., one switch 2 is uniformly deleted from each cell 1xy of the cell array) may be performed.

As described above, a series of processes including the generation of switch-deleted structure description information 11a, the placement and routing of an application circuit on the switch-deleted structure description information 11a, the evaluation of the placement and routing result, and further deletion of switches is repeated for several times. Further, in each series of process, one switch 2, for example, is deleted from each cell 1xy. Eventually, the circuit generation unit 12a finishes the process when the number of switch-deleted structure description information pieces 11a having an evaluation value better than the pass threshold becomes zero. Then, the circuit generation unit 12a determines the switch-deleted structure description information 11a having an evaluation value better than the pass threshold that is obtained immediately before the termination of the process as the final architecture result. In this way, it is possible to design switch-deleted structure description information 11a including the smallest number of switches among the switch-deleted structure description information pieces 11a on which the application circuit can be placed and routed.

Further, other examples of the above-described evaluation value may include critical path delay when an application circuit can be placed and routed, power consumption, the size (area) of switch-deleted structure description information 11a, and the product of the numerical values of these properties. Further, among the switch-deleted structure description information pieces 11a of which the above-described routing property is better than the pass threshold, only the switch-deleted structure description information pieces 11a of which an additional evaluation value(s) such as critical path delay and power consumption is also better than a certain pass threshold may be left undiscarded. The type of evaluation method that is actually employed can be determined according to the purpose of the designer.

In this way, the circuit generation unit 11a generates switch-deleted structure description information 11a including the smallest number of switches 2 (hereinafter called "minimum uniform configuration circuit information") among switch-deleted structure description information pieces 11a of which the evaluation value is better than the pass threshold by performing a uniform switch deletion.

Next, the nonuniform switch deletion is explained in detail. There are many cases where the satisfactory switch deletion cannot be achieved by the uniform switch deletion. In such cases, the circuit generation unit 12a further performs a nonuniform switch deletion on the minimum uniform configuration circuit information generated in the above-described method.

Figure 10A:
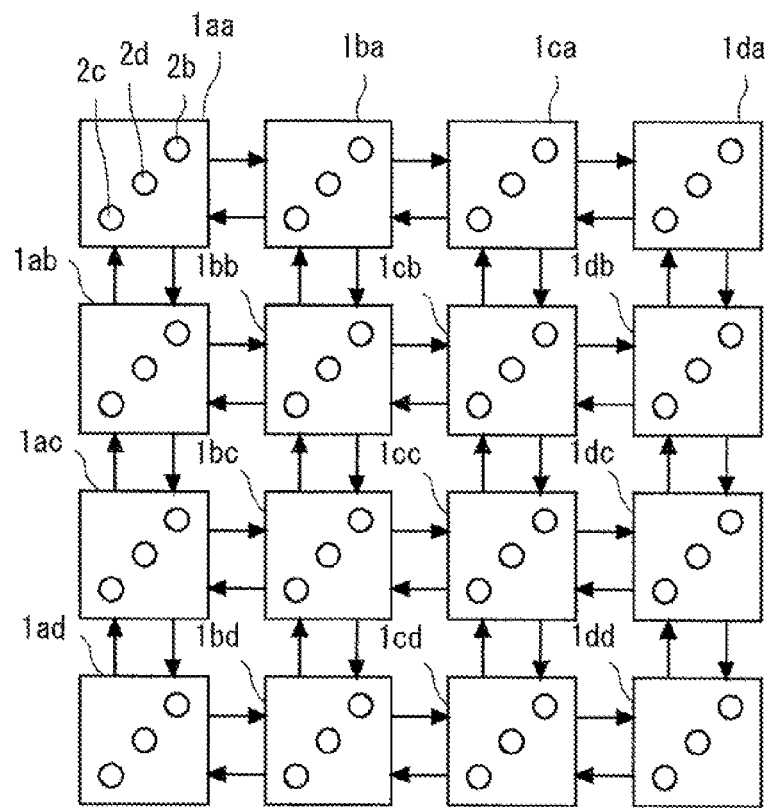
FIG. 10A shows an example of a cell array of a minimum uniform reconfiguration circuit.

FIG. 10A shows an example of minimum uniform configuration circuit information. In FIG. 10A, an example of a cell array obtained by deleting two switches 2a and 2e from each cell 1xy of the structure description information 11a shown in FIG. 3. When the circuit generation unit 12a performs a nonuniform switch deletion, it first performs a switch delete process of FIG. 7 (step S105) on this minimum uniform configuration circuit information. In this switch delete process, the circuit generation unit 12a performs, for example, a nonuniform switch deletion described later.

Figure 10B:
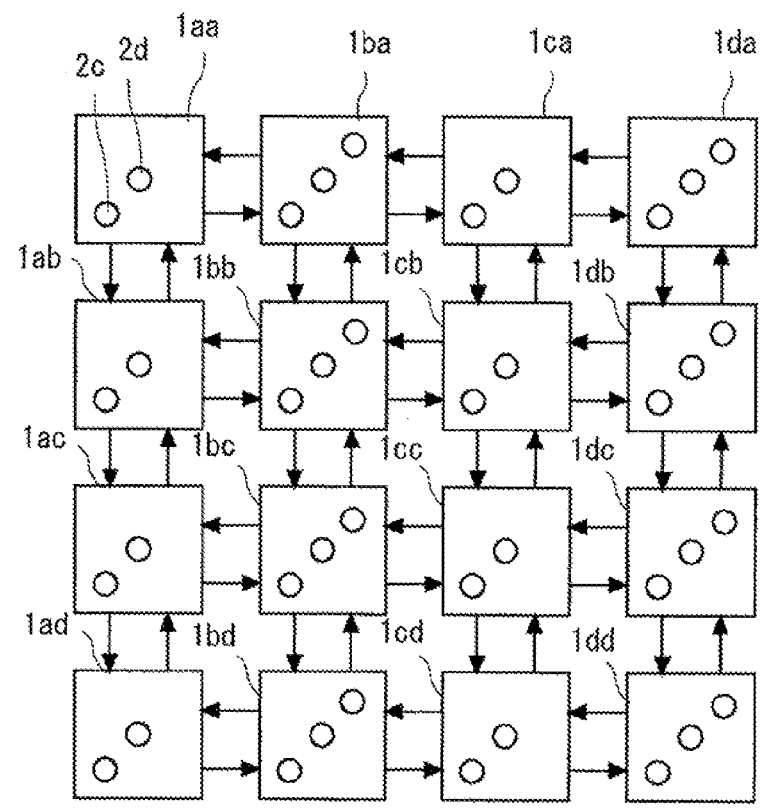
FIG. 10B shows an example of a cell array in which switches are deleted from each cell located on odd-numbered columns among a cell array of a minimum uniform reconfiguration circuit in a nonuniform manner.

FIG. 10B shows a cell array obtained by deleting a switch 2b from each cell located on the odd-numbered columns (first column 1ay and third column 1cy, where "y" is one of "a" to "d") of the cell array shown in FIG. 10A. Similarly, FIG. 10C shows a cell array obtained by deleting a switch 2c from each of the cells 1ay and cells 1cy located on the odd-numbered columns of the cell array shown in FIG. 10A.

Note that although a method in which the switch 2b or 2c is deleted from each cell 1xy of the cell array is shown in FIGS. 10B and 10C as an example, the present invention is not limited to this example. In general, when there are m switches 2 in each cell 1xy, there are m types of ways of deleting one switch.

Therefore, when one switch 2 is to be deleted from each cell 1xy located on the odd-numbered columns of the cell array, m switch-deleted structure description information pieces 11a are generated at the maximum. Further, in this case, no switch is deleted from the cells located on the even-numbered columns of the cell array. The deletion process in which the way of deleting switches is different depending on the place of the cell 1xy in the cell array as described above is referred to as "nonuniform switch deletion".

Then, the circuit generation unit 12a performs the following series of processes shown in FIG. 7 on the generated switch-deleted structure description information 11a (all or part of in switch-deleted structure description information pieces 11a). That is, the circuit generation unit 12a places and routes an application circuit expressed by the application circuit netlist information 11b by using a placement-and-routing tool into which each of the switch-deleted structure description information pieces 11a was taken (step S102), and the circuit evaluation unit 12b evaluates each placement and routing result (step S103). By using the evaluation result, the circuit generation unit 12a performs a switch delete process again on the switch-deleted structure description information pieces 11a that satisfy the pass threshold (step S105).

In this switch delete process, the circuit generation unit 12a performs, at this time, a switch deletion on each cell located on the even-numbered columns (second column 1by and fourth column 1dy, where "y" is one of "a" to "d") of the cell array. After that, the above-described series of processes including the placement and routing, the evaluation, and the switch deletion is repeated. Further, in the switch delete process, the circuit generation unit 12a preferably performs the switch deletion processes on the odd-numbered columns and even-numbered columns of the cell array in an alternate manner as described above.

Note that if the switch deletion process is performed on the even-numbered columns and odd-numbered columns of the cell array at the same time, the number of possible deletion patterns becomes so large that the processing time increases. In contrast to this, when the circuit generation unit 12a performs the switch deletion processes on the even-numbered columns and odd-numbered columns in an alternate manner as described above, the evaluation is performed between both processes by the circuit evaluation unit 12b. As a result, the screening of switch-deleted structure description information pieces 11a is performed based on the evaluation, and therefore the number of switch-deleted structure description information pieces 11a is effectively narrowed down.

Note that if the circuit generation unit 12a performs the switch deletion process on the even-numbered columns and odd-numbered columns of the cell array at the same time, the circuit evaluation unit 12b makes an evaluation only once. In contrast to this, if the circuit generation unit 12a performs switch the deletion processes on the even-numbered columns and odd-numbered columns of the cell array in an alternate manner, the circuit evaluation unit 12b makes an evaluation twice. Even in this case, the merit that switch-deleted structure description information pieces 11a is temporarily narrowed down during the process is larger.

Further, even if the circuit generation unit 12a cannot delete any switch 2 on one of the odd-numbered columns and even-numbered columns (for example, on the even numbered columns), the circuit evaluation unit 12b still continues to perform the switch delete process on the other one of the odd-numbered columns and even-numbered columns (for example, on the odd-numbered columns) if the switch deletion on those columns is possible.

Therefore, there are cases where the number of switches in each cell 1xy is different between the even-numbered columns and the odd-numbered columns of the cell array in the final result. Further, even when the number of switches in each cell 1xy is the same between the even-numbered columns and the odd-numbered columns, the switch 2 to be deleted in each cell is not necessarily the same between the even-numbered columns and the odd-numbered columns.

Further, when the circuit generation unit 12a has performed a nonuniform switch deletion, it registers a pair of switch deletion patterns of the odd-numbered columns and even-numbered columns of a switch-deleted structure description information piece 11a for which the evaluation is poor in the prohibition list information 11c.

Further, there is a case where a switch deletion pattern of the even-numbered columns in a given switch-deleted structure description information piece 11a includes a switch delete pattern of even-numbered columns of a given pair in the prohibition list information 11c, and at the same time, a switch delete pattern of the odd-numbered columns in that given switch-deleted structure description information piece 11a includes a switch delete pattern of odd-numbered columns of that given pair in the prohibition list information 11c. In this case, the circuit generation unit 12a discards that switch-deleted structure description information piece 11a, thus performing the above-described narrowing down of the switch-deleted structure description information pieces 11a.

In this manner, the circuit generation unit 12a performs a nonuniform switch deletion, and by doing so, generates switch-deleted structure description information 11a having the smallest number of switches (hereinafter referred to as "minimum nonuniform configuration circuit information") among the switch-deleted structure description information pieces 11a for which the evaluation is better than the pass threshold.

The nonuniform switch deletion which is performed on a cell array where cells 1xy are identical (uniform) on each column but in which the way of deleting switches is different between different columns as describe above is referred to as "column-nonuniform switch deletion".

Note that although a case where the way of deleting switches is different between two types of columns, i.e., between the even-numbered columns and odd-numbered columns is explained as an example of a basic column-nonuniform switch deletion in the above explanation, the number of types of different columns may be more than two. For example, when there are k types of different columns, the circuit generation unit 12a may perform a switch deletion successively from the first column to kth column of the cell array, and the circuit evaluation unit 12b may evaluate the switch-deleted structure description information 11a. Then, after this evaluation, the process may be repeated from the first column.

In the prohibition list information 11c, a set of switch deletion patterns from the first column to kth column in switch-deleted structure description information 11a for which the evaluation was poor is registered. Then, when a switch delete pattern of ith column ($1 \le i \le k$) in a given switch-deleted structure description information piece 11a includes a switch delete pattern of ith column of a given set in the prohibition list information 11c (assuming that the above-described condition holds for all of the cases of i=1 to i=k), the circuit generation unit 12a discards that switch-deleted structure description information piece 11a, thereby narrowing down the switch-deleted structure description information pieces 11a.

Next, the circuit generation unit 12a performs a nonuniform switch deletion on the minimum uniform configuration circuit information on a row-by-row basis (hereinafter referred to as "row-nonuniform switch deletion"). This row-nonuniform switch deletion is a nonuniform switch deletion method which is performed on a cell array where cells 1xy are identical (uniform) on each row but in which the way of deleting switches is different between different rows.

Further, in the row-nonuniform switch deletion, the circuit generation unit 12a preferably performs the switch deletion processes on the odd-numbered rows and even-numbered rows of the cell array in an alternate manner as in the case of the above-described column-nonuniform switch deletion.

Figure 11:
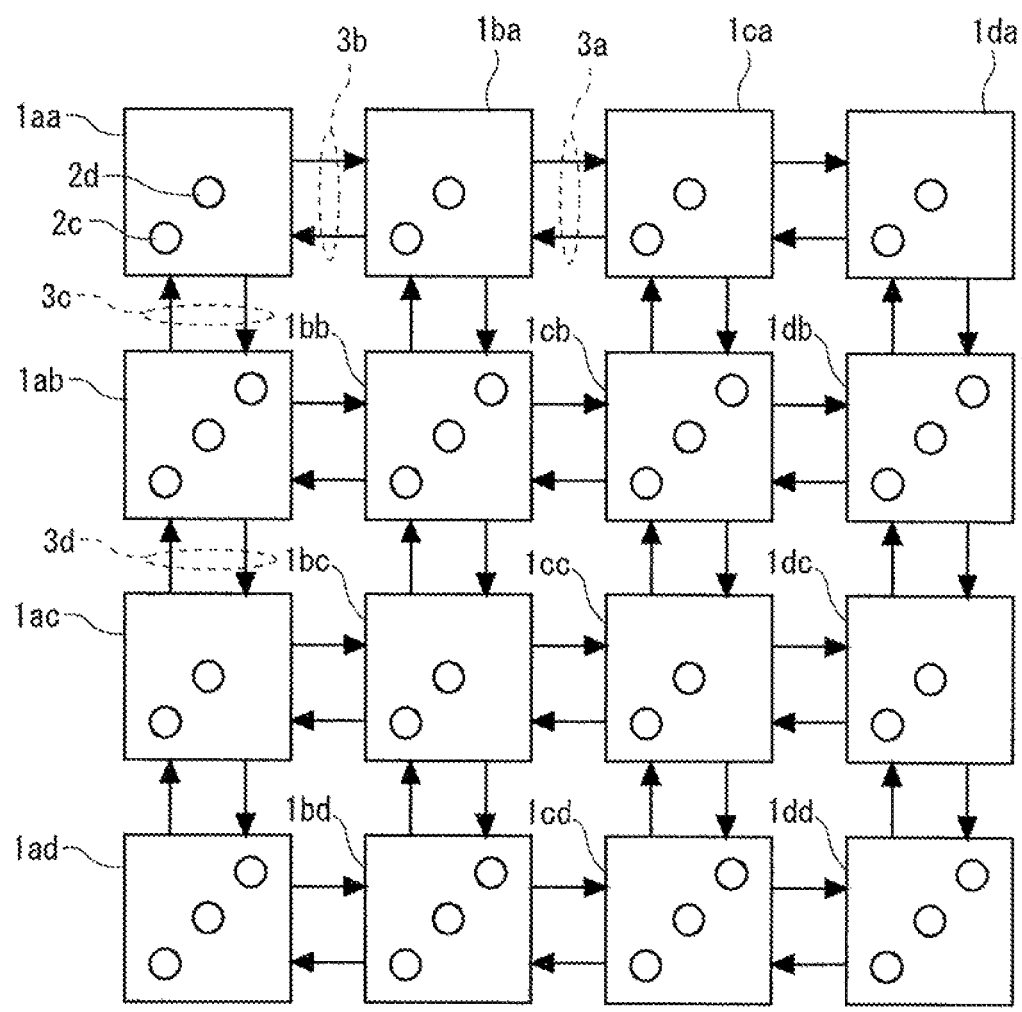
FIG. 11 shows an example of a cell array in which switches are deleted from each cell located on odd-numbered rows among a cell array of a minimum uniform reconfiguration circuit in a nonuniform manner.

FIG. 11 shows an example of a cell array obtained by deleting a switch 2b from each cell located on the odd-numbered rows (first row 1xa and third row 1xc, where "x" is one of "a" to "d") of the cell array of the minimum nonuniform configuration circuit information shown in FIG. 10A.

Finally, the circuit generation unit 12a compares the evaluation of the minimum nonuniform configuration circuit information obtained by the column-nonuniform switch deletion and the evaluation of the minimum nonuniform configuration circuit information obtained by the row-nonuniform switch deletion, and adopts the minimum nonuniform configuration circuit information having a better evaluation between them as the final minimum nonuniform configuration circuit information.

As described above, the circuit generation unit 12a first performs a uniform switch deletion on structure description information 11a to generate minimum uniform configuration circuit information (step S110 in FIG. 8). Next, the circuit generation unit 12a performs a column-nonuniform switch deletion on this minimum uniform configuration circuit information (step S112) to generate minimum nonuniform configuration circuit information.

Further, the circuit generation unit 12a also performs a row-nonuniform switch deletion on the minimum uniform configuration circuit information (step S113) to generate minimum nonuniform configuration circuit information. Then, the circuit generation unit 12a adopts one of the generated minimum nonuniform configuration circuit information pieces for which the evaluation given by the circuit evaluation unit 12b is better than the other (step S114).

Figures 12A, 12B, 12C, 12D, 12E:
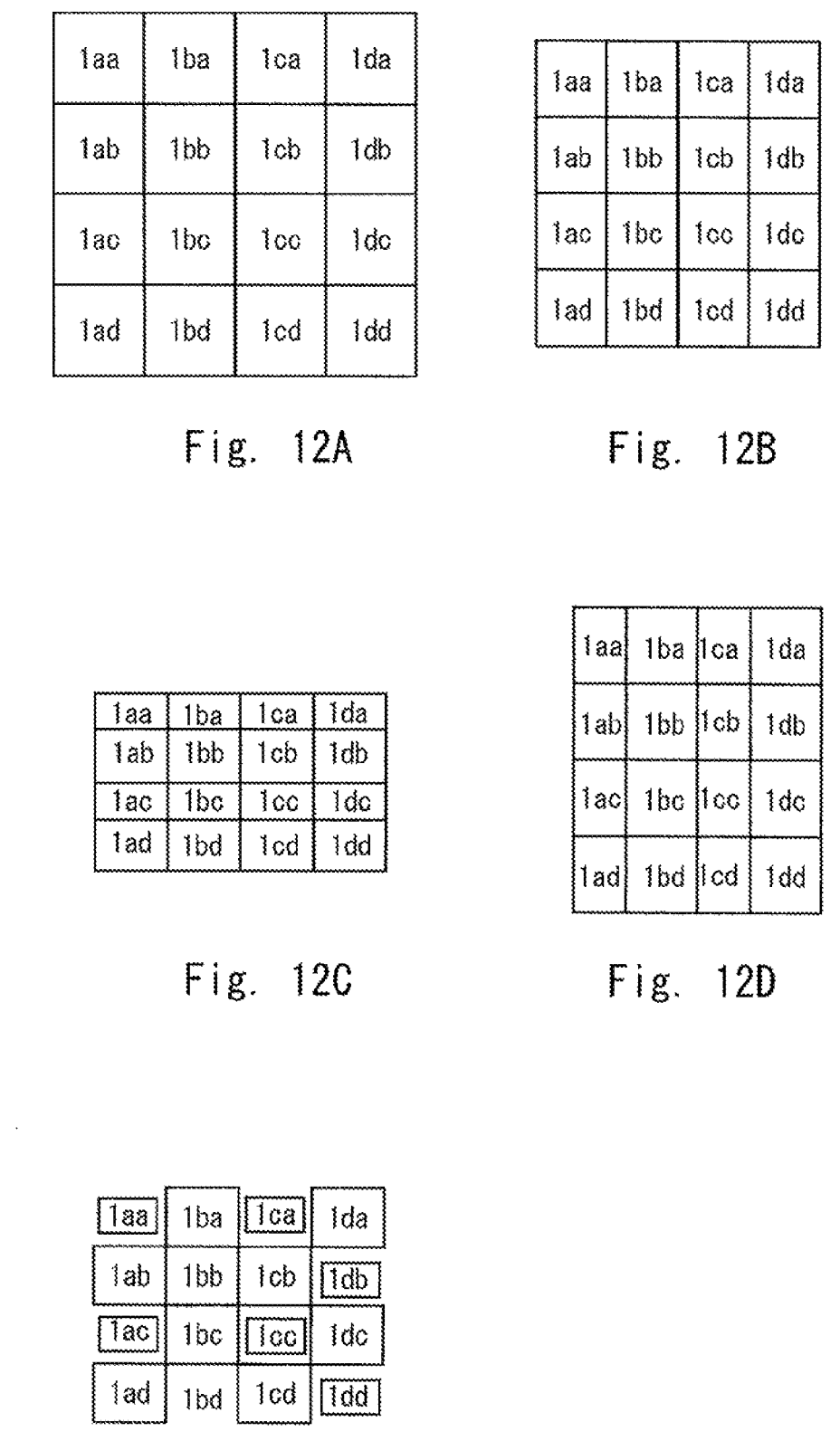

FIGS. 12A to 12E are schematic diagrams each showing a physical arrangement of a reconfigurable circuit expressed by structure description information 11a on silicon. FIG. 12A shows initial structure description information 11a, in which each cell 1xy (each of "x" and "y" is one of "a" to "d") of the cell array is arranged in a two-dimensional array in an orderly manner without leaving any space therebetween.

FIG. 12B is a schematic diagram showing an example of a minimum uniform configuration circuit. As shown in FIG. 12B, although all the cells 1 xy are smaller than those of the cells 1xy shown in FIG. 12A, the cells 1xy are identical with those. That is, the same switch 2 is deleted in every cell 1xy from the initial structure description information 11a. Therefore, each cell 1xy can be arranged in a two-dimensional array without leaving any space therebetween.

FIG. 12C shows an example of a minimum nonuniform configuration circuit on which a row-nonuniform switch deletion was performed. Note that in the cell array shown in FIG. 12C, the height of each cell 1xy is different between the odd-numbered rows (first row 1xa and third row 1xc) and the even-numbered rows (second row 1xb and fourth row 1xd).

In such a case, in general, the deleted switch 2 is different on a row-by-row basis, and therefore the size of the cells 1xy is different on a row-by-row basis. However, the height of the cells 1xy may be adjusted on a row-by-row basis and the width of all the cells 1xy may be made equal to each other. By doing so, each cell 1xy can be arranged without leaving any space therebetween as shown in FIG. 12C. Note that FIG. 12C shows an example where the height of the cells 1xy is different between the odd-numbered rows and the even-numbered rows of the cell array.

FIG. 12D shows an example of a minimum nonuniform configuration circuit on which a column-nonuniform switch deletion was performed. In such a case, in general, the deleted switch 2 is different on a column-by-column basis, and therefore the size of the cells 1xy is different on a column-by-column basis. However, the width of the cells 1xy may be adjusted on a column-by-column basis and the height of all the cells 1xy may be made equal to each other. By doing so, each cell 1xy can be arranged without leaving any space therebetween as shown in FIG. 12D. Note that FIG. 12D shows an example in which the width of the cells 1xy is different between the odd-numbered columns and the even-numbered columns of the cell array.

By performing a row-nonuniform switch deletion or a column-nonuniform switch deletion in this manner, it provides an advantage that, in a physical arrangement of cells 1xy, each cell 1xy can be arranged in a two-dimensional array without leaving any space therebetween. This feature is not always possible in conventional non-uniformity.

FIG. 12E shows an example of a nonuniform switch deletion in the form of a checker pattern. As shown in FIG. 12E, in this pattern, cells 1aa, 1ac, 1bb, 1bd, 1ca, 1ce, 1db and 1dd having a smaller size and cells 1ab, 1ad, 1ba, 1bc, 1cb, 1cd, 1da and 1dc having a larger size, for example, are arranged in the form of a checker pattern. In this pattern, space is formed between a cell 1xy having the smaller size and its adjacent cells 1xy. Note that as a nonuniform switch deletion method in which any space like this is not formed, it is preferable to perform the above-described row-nonuniform switch deletion or the column-nonuniform switch deletion.

As described so far, in the circuit design system 10 in accordance with the first exemplary embodiment, the storage device 11 stores structure description information 11a of a reconfigurable circuit including a cell array including a plurality of switches 2, and application circuit netlist information 11b. Further, the circuit generation unit 12a of the CAD device 12 generates structure description information 11a by deleting at least one switch 2 from the structure description information 11a based on an evaluation result obtained by the circuit evaluation unit 12b. In this way, each switch 2 is successively deleted from structure description information 11a in which individual switches 2 are described without parameterizing the structure description information as performed in the conventional methods. As a result, a more detailed switch deletion can be performed according to an application, thus effectively reducing the circuit size.

Further, various switch deletion patterns are evaluated while specifying an individual switch 2, and a row-nonuniform switch deletion or a column-nonuniform switch deletion in addition to a uniform switch deletion is performed. In this way, it is possible to generate a reconfigurable circuit that is specified to a certain application area and has a small size in a short processing time. Further, since switch deletion patterns are effectively narrowed down by using the prohibition list information 11c containing a list of switch deletion patterns having a poor evaluation, the processing time is significantly reduced.

Note that in general, performing a detailed switch deletion tends to require a longer processing time. This is because, even when the same number of switches are to be deleted, since there are several candidates for the switch 2 to be deleted, there are a number of deletion patterns. If the trial of placement and routing is repeated for all the possible switch deletion patterns, it takes a huge amount of processing time, thus making it practically infeasible.

Therefore, in the circuit design system 10 in accordance with the first exemplary embodiment of the present invention, a predetermined number of switches 2 (e.g., one switch 2) is deleted from each cell 1xy, and the placement and routing are evaluated. Then, by leaving only the switch-deleted structure description information pieces 11a for which the evaluation value is better than the pass threshold, switch-deleted structure description information pieces 11a that are to be taken over to the next process are narrowed down.

Then, when the circuit generation unit 12a deletes a predetermined number of switches 2 from these switch-deleted structure description information pieces 11a and generates switch-deleted structure description information pieces 11a again, the circuit generation unit 12a discards any switch-deleted structure description information 11a including a switch deletion pattern registered in the prohibition list information 11c. With this discarding operation, the circuit generation unit 12a narrows down the number of switch-deleted structure description information pieces 11a that are taken over to the next process. In this way, the circuit generation unit 12a repeats the process in which a certain number of switches 2 are deleted and the number of switch-deleted structure description information pieces 11a is thereby narrowed down. As a result, it is possible to prevent the number of switch-deleted structure description information pieces 11a from diverging to infinity during the process. Therefore, not to mention that it is possible to generate minimum uniform configuration circuit information by the uniform switch deletion in a realistic processing time, it is also possible to generate minimum nonuniform configuration circuit information by the nonuniform switch deletion in a realistic processing time.

Further, the circuit generation unit 12a can delete a number of switches by performing a nonuniform switch deletion after a uniform switch deletion. If any given non-uniformity is allowed in the nonuniform switch deletion, the number of switch deletion patterns increases enormously. Therefore, it is unrealistic. Therefore, in the circuit design system 10 in accordance with the first exemplary embodiment of the present invention, only the uniformity on a row-by-row basis in which cells 1xy are identical on each row of the cell array but the switch deletion pattern is different on a row-by-row basis, or the uniformity on a column-by-column basis in which cells 1xy are identical on each column of the cell array but the switch deletion pattern is different on a column-by-column basis is allowed. In this way, it is possible to suppress the increase in the number of switch deletion patterns due to the non-uniformity.

[Second Exemplary Embodiment]

Figure 13:
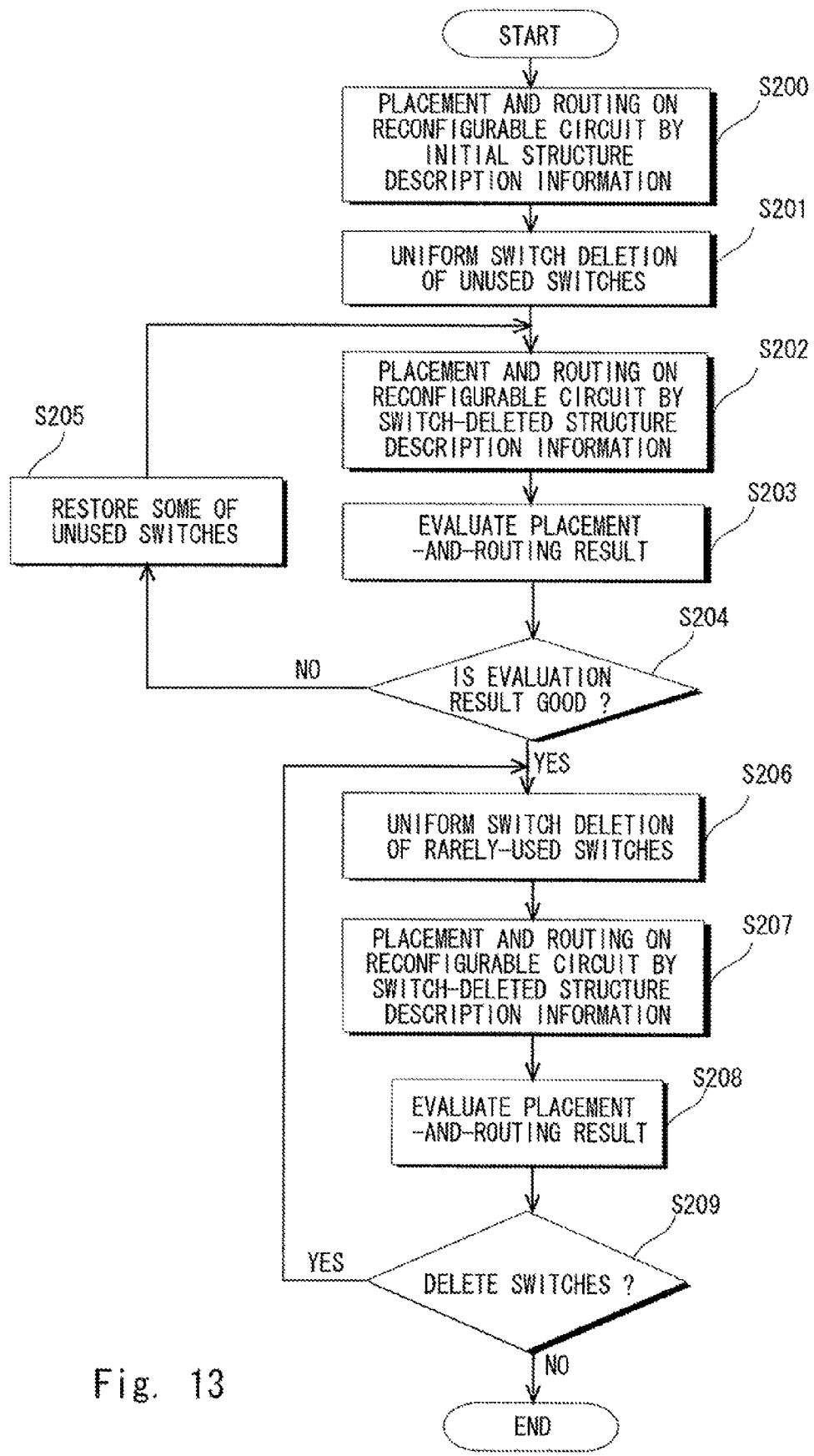
FIG. 13 is a flowchart showing an example of a flow of a circuit design system in accordance with a second exemplary embodiment of the present invention.

Next, a circuit design method of a circuit design system 10 in accordance with a second exemplary embodiment of the present invention is explained. The circuit design method of the circuit design system 10 in accordance with the second exemplary embodiment is different from the circuit design method of the circuit design system 10 in accordance with the first exemplary embodiment mainly in that a uniform switch deletion of an unused switch 2 in each cell 1xy is performed, and in that a uniform switch deletion of a rarely-used switch 2 is performed. FIG. 13 is a flowchart showing an example of a flow of a circuit design system 10 in accordance with the second exemplary embodiment of the present invention.

Firstly, the circuit generation unit 12a places and routes an application circuit expressed by application circuit netlist information 11b on a reconfigurable circuit expressed by initial structure description information 11a by a placement-and-routing tool into which the initial structure description information 11a was taken (step S200).

Next, the circuit generation unit 12a further deletes unused switches 2 that are not used in all the cells 1xy, in the result of the above-described placement and routing, from the initial structure description information 11a in a uniform manner, and thereby generates switch-deleted structure description information 11a (step S201). In this process, all of the unused switches 2 are deleted at once. After that, the circuit generation unit 12a places and routes the application circuit expressed by the application circuit netlist information 11b on the reconfigurable circuit expressed by the switch-deleted structure description information 11a by the placement-and-routing tool into which the switch-deleted structure description information 11a was taken (step S202). Then, the circuit evaluation unit 12b evaluates the result of the above-described placement and routing (step S203).

If the evaluation value obtained by the circuit evaluation unit 12b is worse than the pass threshold (No at step S204), the circuit generation unit 12a restores some of the above-described deleted unused switches 2 in all the cells 1xy of the switch-deleted structure description information 11a (step S205) and the process returns to the above-described step S202.

Note that in general, there are a plurality of ways of restoring the above-described deleted unused switches 2 (i.e., which of the deleted unused switches 2 should be restored). Therefore, when the circuit generation unit 12a performs the above-described process (step, S205), a plurality of switch-deleted structure description information pieces 11a are usually generated. In the above-described determination process (step S204), when the number of obtained switch-deleted structure description information pieces 11a for which the evaluation value is better than the pass threshold is equal to or greater than a desired number, the circuit generation unit 12a proceeds to the uniform switch deletion of rarely-used switches 2 (which is described later) (step S206).

Note that if the circuit generation unit 12a determines that the evaluation value of the switch-deleted structure description information 11a is better than the pass threshold in the first determination process in the above-described step S204, the circuit generation unit 12a may proceed to the uniform switch deletion of rarely-used switches 2 (which is described later) (step S206). The determination criterion in the above-described determination process (step S204) can be determined according to the purpose of the designer.

In the uniform switch deletion of rarely-used switches 2 (step S206), the circuit generation unit 12a uniformly deletes switches 2 that are used only in a small number of cells 1xy (e.g., only in one cell) in the cell array in the result of the above-described placement and routing.

For example, if there are j switches 2 that are used only in one cell 1xy, there are j types of ways of deleting one switch 2. Therefore, in the uniform switch deletion process of rarely-used switches 2 (step S206), when one switch 2 is to be deleted, the circuit generation unit 12a generates j switch-deleted structure description information pieces 11a.

The subsequent processes are roughly the same as the process flow in accordance with the first exemplary embodiment shown in FIG. 7. That is, for each of the above-described j switch-deleted structure description information pieces 11a, the circuit generation unit 12a places and routes the application circuit expressed by the application circuit netlist information 11b on the reconfigurable circuit expressed by respective switch-deleted structure description information piece 11a by the placement-and-routing tool into which respective switch-deleted structure description information piece 11a was taken (step S207).

Next, the circuit evaluation unit 12b evaluates the result of the above-described placement and routing (step S208). The circuit generation unit 12a determines whether a further switch deletion should be performed or not based on the evaluation result obtained by the circuit evaluation unit 12b (step S209). When the circuit generation unit 12a determines that a switch deletion of the switch-deleted structure description information 11a should be performed (Yes at step S209), the process returns to the above-described step S206. On the other hand, when the circuit generation unit 12a determines that no further switch deletion of the switch-deleted structure description information 11a should be performed (No at step S209), this process is finished. Note that the row-nonuniform switch deletion or the column-nonuniform switch deletion can be easily applied in the deletion of rarely-used switches 2.

As described so far, according to the circuit design system 10 in accordance with the second exemplary embodiment, after the above-described placement and routing, all the unused switches 2 are deleted in the process shown in FIG. 13 (step S201). As a result, the circuit design method in accordance with the second exemplary embodiment has an advantage that the processing time can be significantly reduced in comparison to the processing method in which one or a few switches 2 are deleted at a time and placement and routing as well as the evaluation are repeated. In most cases, the circuit generation unit 12a can place and route an application circuit on switch-deleted structure description information 11a from which unused switches 2 were deleted. Therefore, the circuit generation unit 12a proceeds to Yes side (step S206) in the determination process shown in FIG. 13 (step S204).

However, there are cases where the circuit generation unit 12a cannot perform the above-described placement and routing, or where the evaluation of the above-described placement and routing given by the circuit evaluation unit 12b is poor. In such cases, the circuit generation unit 12a restores a few (typically one) of the deleted unused switches 2, so that the process proceeds to Yes side in the above-described determination process (step S204).

Note that even if the circuit generation unit 12a temporarily restores some of the deleted unused switches 2, the larger number of switches 2 than the number of these unused switches 2 can be eventually deleted in most cases. This is because the circuit generation unit 12a also deletes switches 2 other than the unused switches 2 in the process of FIG. 13 (step S206) and the subsequent processes.

Further, when each cell 1xy includes n switches 2, there are n types of ways of deleting one switch 2 from each cell 1xy in all. Meanwhile, the number of rarely-used switches 2 is very small among n switches. Therefore, by limiting the switch 2 to be deleted to the rarely-used switches 2, the number of switch-deleted structure description information pieces 11a from which switches 2 are to be further deleted can be significantly narrowed down, thereby significantly reducing the total processing time. Further, the above-described method is reasonable in that the rarely-used switches 2 are preferentially deleted in order to suppress the deterioration of the evaluation obtained by the circuit evaluation unit 12b as much as possible. As described above, according to the circuit design system 10 in accordance with the second exemplary embodiment of the present invention, the deletion of a number of switches 2 can be achieved in a short time.

Note that the present invention is not limited to the above-described exemplary embodiments, and various modifications can be made without departing from the spirit of the present invention.

Reference Signs List
1 CELL
2 SWITCH
3 ROUTING LINE
4 FUNCTIONAL BLOCK
5 MULTIPLEXER
6 BUFFER
7 INPUT LINE
8 OUTPUT
10 CIRCUIT DESIGN SYSTEM
11 STORAGE DEVICE
11a STRUCTURE DESCRIPTION INFORMATION
11b APPLICATION CIRCUIT NETLIST INFORMATION
11c PROHIBITION LIST INFORMATION
12 CAD DEVICE
12a CIRCUIT GENERATION UNIT
12b CIRCUIT EVALUATION UNIT

The invention claimed is:

1. A circuit design system comprising:
storage device to store structure description information of a reconfigurable circuit including an array of cells including a plurality of switches, and application circuit information used to specify an application;
circuit generation unit to generate structure description information based on the structure description information and the application circuit information stored in the storage device; and
circuit evaluation unit to evaluate the structure description information generated by the circuit generation unit,
wherein the circuit generation unit generates the structure description information by deleting at least one of the switches from the structure description information based on an evaluation result obtained by the circuit evaluation unit, and
the circuit generation unit performs a uniform switch deletion in which a same switch is deleted from each of all the cells.

2. The circuit design system according to claim 1, wherein the circuit generation unit adopts structure description information including a smallest number of switches of the generated structure description information.

3. The circuit design system according to claim 1, wherein after the uniform switch deletion, the circuit generation unit performs a nonuniform switch deletion in which a different switch is deleted from each of the cells.

4. The circuit design system according to claim 3, wherein in the nonuniform switch deletion, the circuit generation unit deletes switches in cells on the odd-numbered columns and switches in cells on the even-numbered columns of the cell array in an alternate manner.

5. The circuit design system according to claim 3, wherein in the nonuniform switch deletion, the circuit generation unit deletes switches in cells on the odd-numbered rows and switches in cells on the even-numbered rows of the cell array in an alternate manner.

6. The circuit design system according to claim 4, wherein the circuit generation unit adopts structure description information having a better evaluation between the structure description information generated by the circuit generation unit by deleting a switch in each cell on the column-by-column basis and the structure description information generated by deleting a switch in each cell on the row-by-row basis.

7. The circuit design system according to claim 1, wherein the storage device stores a switch deletion pattern obtained by the circuit evaluation unit by deleting switches as prohibition list information based on an evaluation result obtained by the circuit evaluation unit, and
the circuit generation unit does not generate the structure description information when the switch deletion pattern obtained by deleting switches matches a switch deletion pattern of the prohibition list information stored in the storage device.

8. The circuit design system according to claim 1, wherein the circuit generation device generates the structure description information by deleting unused switches from all the cells of the circuit information.

9. The circuit design system according to claim 8, wherein when an evaluation result obtained by the circuit evaluation device for the structure description information from which the unused switches were deleted is not satisfactory, the circuit generation device restores a part of the deleted unused switches.

10. The circuit design system according to claim 1, wherein the circuit generation device generates the structure description information by deleting rarely-used switches from all the cells of the structure description information.

11. The circuit design system according to claim 10, wherein the rarely-used switches are switches that are used only in one, two or three of the cells in the cell array.

12. The circuit design system according to claim 1, wherein the circuit evaluation device evaluates at least one of success/failure of placement and routing in the generated structure description information, routing property, circuit delay, power consumption, number of the switches, and circuit size.

13. A circuit design method comprising:
storing structure description information of a reconfigurable circuit including an array of cells including a plurality of switches, and application circuit information used to specify an application implemented at least by hardware;
generating structure description information based on the stored structure description information and the application circuit information implemented at least by the hardware; and
evaluating the generated structure description information implemented at least by the hardware,
wherein the structure description information is generated by deleting at least one of the switches from the structure description information based on the evaluation result, and a uniform switch deletion in which a same switch is deleted from each of all the cells is performed.

14. The circuit design method according to claim 13, wherein structure description information including a smallest number of switches is adopted of the generated structure description information.

15. The circuit design method according to claim 13, wherein
after the deletion, a different cell is deleted from each of the cells.

16. The circuit design method according to claim 13, wherein
a switch deletion pattern obtained by deleting switches is stored as prohibition list information based on the evaluation result, and
the structure description information is not generated when the switch deletion pattern obtained by deleting switches matches a switch deletion pattern of the stored prohibition list information.

17. A non-transitory computer readable storage medium storing a program that causes a computer to execute:
generating structure description information based on structure description information of a reconfigurable circuit including an array of cells including a plurality of switches, and application circuit information used to specify an application, implemented at least by hardware;
evaluating the generated structure description information implemented at least by the hardware; and
generating the structure description information by deleting at least one of the switches from the structure description information based on the evaluation result, wherein a same switch is deleted from each of all the cells implemented at least by the hardware.

* * * * *